(12) United States Patent
Shen et al.

(10) Patent No.: US 7,176,130 B2
(45) Date of Patent: Feb. 13, 2007

(54) PLASMA TREATMENT FOR SURFACE OF SEMICONDUCTOR DEVICE

(75) Inventors: Jin Miao Shen, Austin, TX (US); Brian J. Fisher, Austin, TX (US); Mark D. Hall, Austin, TX (US); Kurt H. Junker, Austin, TX (US); Vikas R. Sheth, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 41 days.

(21) Appl. No.: 10/987,790

(22) Filed: Nov. 12, 2004

(65) Prior Publication Data

US 2006/0105568 A1 May 18, 2006

(51) Int. Cl.
*H01L 21/441* (2006.01)

(52) U.S. Cl. .............. 438/671; 438/694; 438/788; 438/636

(58) Field of Classification Search ........... 438/798, 438/674, 788, 694, 636
See application file for complete search history.

(56) References Cited

U.S. PATENT DOCUMENTS

| | | | |
|---|---|---|---|
| 5,536,681 A | 7/1996 | Jang | |
| 5,635,425 A * | 6/1997 | Chen | 438/631 |
| 5,807,660 A * | 9/1998 | Lin et al. | 430/313 |
| 5,880,018 A * | 3/1999 | Boeck et al. | 438/619 |
| 5,976,992 A * | 11/1999 | Ui et al. | 438/788 |
| 6,143,666 A * | 11/2000 | Lin et al. | 438/725 |
| 6,187,688 B1 | 2/2001 | Ohkuni | |
| 6,306,771 B1 * | 10/2001 | Syau et al. | 438/706 |
| 6,316,167 B1 | 11/2001 | Angelopoulos | |
| 6,417,084 B1 | 7/2002 | Singh | |
| 6,423,384 B1 | 7/2002 | Khazeni | |
| 6,428,894 B1 | 8/2002 | Babich | |
| 6,503,818 B1 | 1/2003 | Jang | |
| 6,548,423 B1 * | 4/2003 | Plat et al. | 438/780 |
| 6,656,830 B1 * | 12/2003 | Subramanian et al. | 438/618 |
| 6,716,571 B2 * | 4/2004 | Gabriel et al. | 430/313 |
| 6,894,342 B1 * | 5/2005 | Hui et al. | 257/317 |
| 6,972,255 B2 * | 12/2005 | Reber et al. | 438/669 |

* cited by examiner

*Primary Examiner*—Andy Huynh
*Assistant Examiner*—David Goodwin
(74) *Attorney, Agent, or Firm*—Daniel D. Hill; Joanna G. Chiu

(57) ABSTRACT

A method for forming a semiconductor device (10) includes forming an organic anti-reflective coating (OARC) layer (18) over the semiconductor device (10). A tetra-ethyl-ortho-silicate (TEOS) layer (20) is formed over the OARC layer (18). The TEOS layer (20) is exposed to oxygen-based plasma at a temperature of at most about 300 degrees Celsius. In an alternative embodiment, the TEOS layer (20) is first exposed to a nitrogen-based plasma before being exposed to the oxygen-based plasma. A photoresist layer (22) is formed over the TEOS layer (20) and patterned. By applying oxygen based plasma and nitrogen based plasma to the TEOS layer (20) before applying photoresist, pattern defects are reduced.

23 Claims, 3 Drawing Sheets

US 7,176,130 B2

PLASMA TREATMENT FOR SURFACE OF SEMICONDUCTOR DEVICE

RELATED APPLICATION

This is related to U.S. patent application Ser. No. 10/628,668, filed Jul. 28, 2003 and entitled "A Semiconductor Device Having An Organic Anti-Reflective Coating (ARC) and Method Therefor" and assigned to the current assignee hereof.

FIELD OF THE INVENTION

This invention relates generally to semiconductor manufacture, and more particularly to a plasma treatment for the surface of a semiconductor device.

BACKGROUND OF THE INVENTION

In the manufacture of semiconductor devices, features are lithographically defined, in part, by exposing patterned photoresist to light at a certain wavelength and etched. Two known techniques used in a patterned etch are inorganic anti-reflective coating (ARC) hard masking and spin-on organic bottom anti-reflective coating (BARC). Inorganic ARC hard masking patterning schemes pose difficulties for some application because the amount of photoresist required to protect the hard mask during the hard mask etch place a lower limit on photoresist thickness. This limit can prevent the use of the thinner photoresist films that give better resolution. Although the spin-on BARC is relatively easier to apply, it is typically so similar to photoresist in its chemical composition and thus etch properties that it also requires a thick photoresist. To circumvent these issues, the use of amorphous carbon thin films underlying a tetra-ethyl-ortho-silicate (TEOS) layer is proposed.

Also, as the technology becomes more advanced, the feature size is reduced to allow more devices to be placed on an integrated circuit (IC) die. However, reducing the feature size in, for example, a gate layer mask, will cause defects in the photoresist and underlying layers to cause pattern defects in the surface of the integrated circuit that render the integrated circuit non-functional.

Therefore, what is needed is a method for reducing pattern defects in the manufacture of advanced semiconductor devices.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, the present invention provides a method for forming a semiconductor device. An organic anti-reflective coating (OARC) layer is formed over the semiconductor device and a tetra-ethyl-ortho-silicate (TEOS) layer is formed over the OARC layer. The TEOS layer is exposed to an oxygen-based plasma at a temperature of at most about 400 degrees Celsius. In an alternative embodiment, the TEOS layer is first exposed to a nitrogen based plasma before being exposed to the oxygen-based plasma. A photoresist layer is formed over the TEOS layer and patterned. By applying oxygen based plasma and nitrogen based plasma to the TEOS layer before applying the photoresist, pattern defects are reduced.

In one aspect, a patterning stack above a conductive material that is to be etched has a patterned photoresist layer that is used to pattern an underlying tetra-ethyl-ortho-silicate (TEOS) layer. The TEOS layer is deposited at a relatively low temperature. The low temperature TEOS layer is over an organic anti-reflective coating (ARC). Before photoresist is formed on the TEOS layer, the TEOS layer is treated with an $N_2$ plasma followed by treatment with an $O_2$ plasma. In another embodiment, the $N_2$ plasma treatment is optional. The treated TEOS layer provides improved adhesion to both the organic ARC and the photoresist, has low defectivity, operates as a hard mask, and serves as a phase shift layer that helps, in combination with the organic ARC, to reduce undesired reflection. The issue with adhesion has become more difficult with the introduction of photoresists designed for 193 nanometer lithography. The following description provides a more complete explanation of the preferred embodiment of the invention as well as other alternative solutions.

Figure 1:
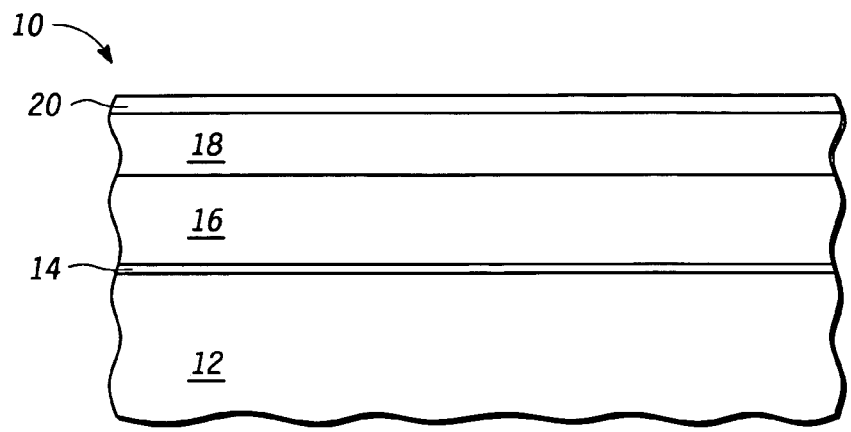
FIG. 1 is a cross section of a semiconductor device according to an embodiment of the invention.

FIG. 1 illustrates a semiconductor device 10 comprising a semiconductor substrate 12, an insulating layer 14 over substrate 12, a conductive material 16 over insulating layer 14, an organic ARC layer 18 over the conductive material 16, and a TEOS layer 20 over organic ARC layer 18. An effective TEOS layer has been deposited using an Applied Materials Centura 5200 DxZ deposition tool using TEOS, oxygen, and helium at 5.5 Torr.

The flow rates are 840 milligrams per minute (mgm) for TEOS, 840 sccm for the oxygen, and 560 sccm for the helium. The power is set at 510 watts for the high frequency and 110 watts for the low frequency. This equipment and these settings are exemplary and could be different. The temperature is intentionally less than the typical deposition temperature of 400 degrees Celsius for TEOS. The temperature is preferably lower than about 350 degrees Celsius. The temperature should also be greater than about 175 degrees Celsius. Preferably, the TEOS layer is formed at a temperature in a range of about 175 to 400 degrees Celsius. In other embodiments, the TEOS layer is formed at a temperature in a range of about 175 to 250 degrees Celsius. Other equipment would almost certainly run at somewhat different conditions and such settings would be determined by experimentation. In this example, substrate 12 is silicon and insulating layer 14 is silicon oxide of about 15 Angstroms. In the illustrated embodiment, the conductive material 16 is polysilicon of about 1000 Angstroms. In other embodiments, the conductive material 16 may be formed from another material, such as an insulating material, a semiconductive material or a conductive material. The organic ARC 18 is an hydrogenated amorphous carbon film deposited by plasma enhanced chemical vapor deposition (PECVD) as is known to one of ordinary skill in the art and is 500 Angstroms thick. Alternatively, a spin-on BARC layer may be used.

Figure 2:
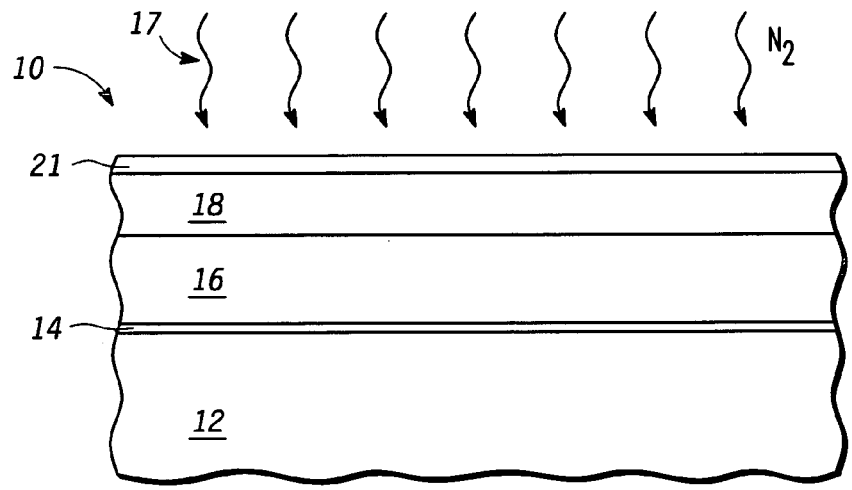
FIG. 2 is a cross section of the semiconductor device of FIG. 1 at a subsequent stage in processing.

FIG. 2 illustrates an $N_2$ based plasma 17 being applied to the TEOS layer 20 resulting in a N2 plasma treated TEOS layer 21. The $N_2$ based plasma treatment of the TEOS layer 20 is preferably used when the TEOS layer 20 is formed at between about 175–400 degrees C., and is optional. In the illustrated embodiment, the $N_2$ based plasma is applied with a platen temperature of preferably about 200 degrees Celsius (C). However, in other embodiments, the platen temperature may be between 20 and 300 degrees C. The flow rate is between about 100–10,000 sccm and preferably about 2000 sccm. The power is between about 50–1200 Watts (W) and preferably about 900 W microwave power. The chamber pressure is 400 to 3000 milliTorr (mTorr) and preferably about 1200 mTorr. The process time may be between about 10 seconds to 5 minutes, and preferably about 35 seconds. In another embodiment, the $N_2$ based plasma may contain a secondary gas such as oxygen or argon.

Figure 3:
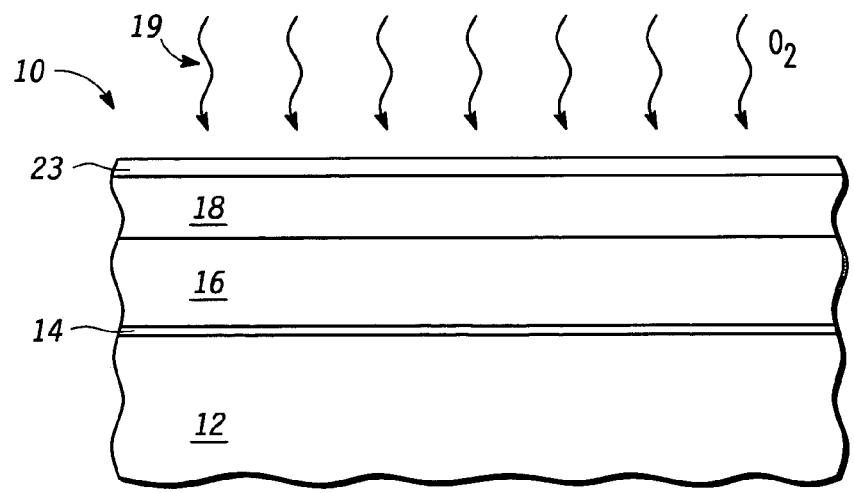
FIG. 3 is a cross section of the semiconductor device of FIG. 2 at a subsequent stage in processing.

FIG. 3 illustrates an $O_2$ based plasma 19 being applied to the TEOS layer 21 resulting in a $O_2$ plasma treated TEOS layer 23. The $O_2$ based plasma treatment of the TEOS layer 21 is preferably used when the TEOS layer 20 is formed preferably at between about 200–300 degrees C. and may be used when the TEOS layer 21 is formed at between about 175–400 degrees C. The $O_2$ based plasma may include a secondary gas, such as for example, $N_2$ in a range of between about 0–50 percent by volume. Preferably, the $O_2$ plasma treatment occurs after the optional $N_2$ plasma treatment illustrated in FIG. 2. The conditions under which the $O_2$ plasma is applied to the TEOS layer is similar to the conditions described above for the $N_2$ plasma. In the illustrated embodiment, the $O_2$ based plasma is applied with a platen temperature of preferably about 200 degrees Celsius (C). However, in other embodiments, the platen temperature may be between 20 and 300 degrees C. The flow rate is between about 100–10,000 sccm and preferably about 2000 sccm. The power is between about 50–1200 Watts (W) and preferably about 900 W microwave power. The chamber pressure is 400 to 3000 milliTorr (mTorr) and preferable about 1200 mTorr. The process time may be between about 10 seconds to 5 minutes, preferably 35 seconds.

Figure 4:
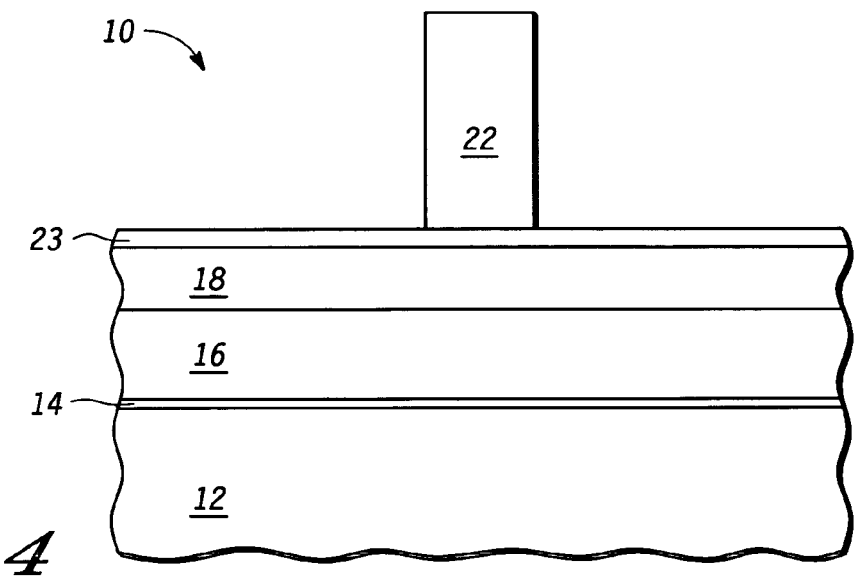
FIG. 4 is a cross section of the semiconductor device of FIG. 3 at a subsequent stage in processing.

FIG. 4 illustrates forming a patterned photoresist layer 22 on the plasma treated TEOS layer 23. In this case patterned photoresist layer 22 is patterned for locating a polysilicon gate of a MOS transistor and is about 2500 Angstroms thick. If a metal is to be patterned instead polysilicon, the thickness of the photoresist is preferably less than 2500 Angstroms. In another embodiment, the photoresist layer 22 may be used to pattern other materials or layers, such as for example, a dielectric layer or for patterning silicon trench isolation (STI).

Figure 5:
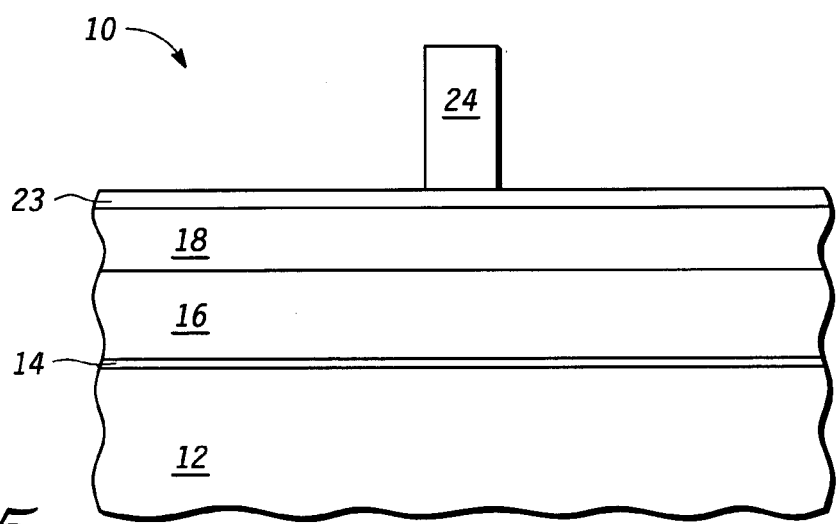
FIG. 5 is a cross section of the semiconductor device of FIG. 4 at a subsequent stage in processing.

FIG. 5 illustrates semiconductor device 10 after lateral thinning of patterned photoresist 22 to form thinned photoresist 24. This lateral thinning is to reduce the width of the pattern. This is a technique for obtaining smaller geometries than can be exposed by the lithography equipment that is available. In the present case for example, patterned photoresist 22 is achieved by an exposure of 0.1 microns (100 nanometers). After thinning, thinned photoresist is about 50 nanometers in width and reduced in thickness to about 1500 Angstroms. The plasma treated TEOS layer 23 is minimally affected by this thinning process.

Figure 6:
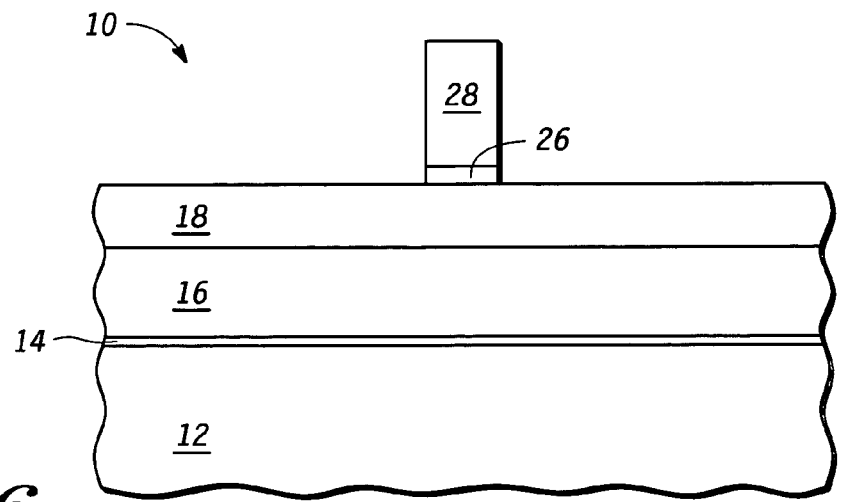
FIG. 6 is a cross section of the semiconductor device of FIG. 5 at a subsequent stage in processing.

FIG. 6 illustrates semiconductor device 10 after TEOS layer 23 has been etched using thinned photoresist 24 as a mask to form a TEOS portion 26 under thinned photoresist 28.

Figure 7:
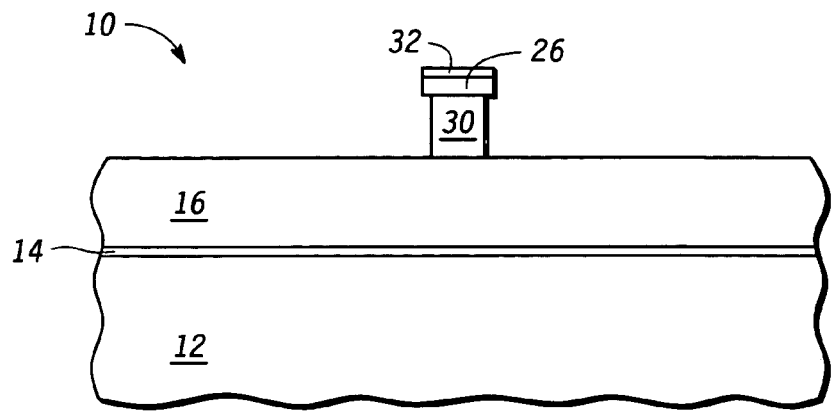
FIG. 7 is a cross section of the semiconductor device of FIG. 6 at a subsequent stage in processing.

FIG. 7 illustrates semiconductor device 10 after organic ARC layer 18 has been etched using thinned photoresist 28 and TEOS portion 26 to form an ARC portion 30. ARC portion 30 is etched using a reactive ion etch. This etch is an anisotropic etch that becomes isotropic after the exposed portion of ARC 18 is removed. The isotropic effect results in undercutting ARC 18 under TEOS portion 26 to leave ARC portion 30 under TEOS portion 26. This is a technique to further reduce the width of the ultimate layer that is to be formed from conductive layer 16. This technique is known to one of ordinary skill in the art.

Figure 8:
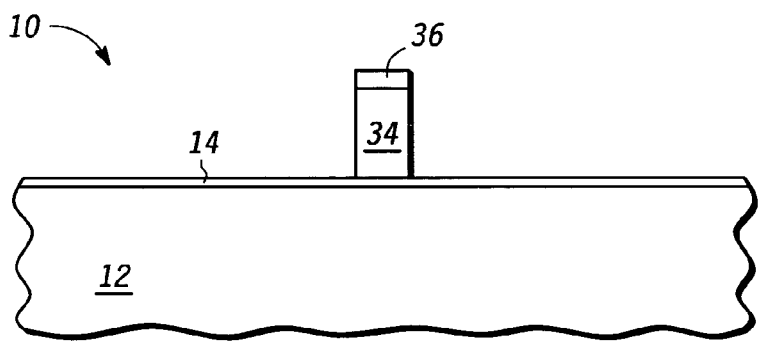
FIG. 8 is a cross section of the semiconductor device of FIG. 7 at a subsequent stage in processing.

FIG. 8 illustrates semiconductor device 10 after conductive material 16 is etched using ARC portion 30 as a mask to leave a gate conductor 34 of polysilicon and a ARC portion 36, which is smaller than ARC portion 30 due to the exposure to etchants used to etch conductive layer 16. This gate conductor 34 could be a different material than polysilicon, such as metal. Metals that are being considered include, but are not limited to, tantalum silicon nitride, titanium nitride, and tungsten. Further, metal gates may be combinations of layers and one of those layers may even include polysilicon in addition to one or more metal layers.

Figure 9:
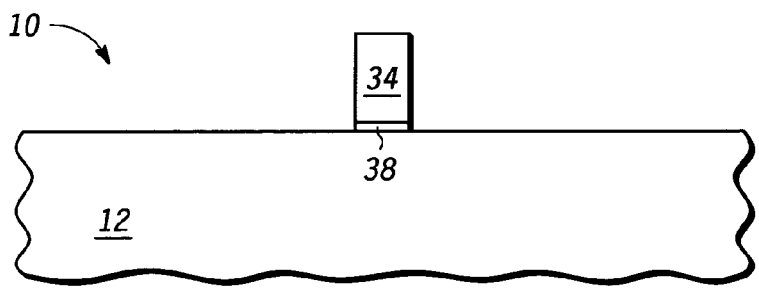
FIG. 9 is a cross section of the semiconductor device of FIG. 8 at a subsequent stage in processing.

FIG. 9 illustrates semiconductor device 10 after removal of ARC portion 36 and the portion of insulating layer 14 that is exposed in FIG. 8 to leave a gate dielectric 38 under gate conductor 34. This removal of ARC portion 36 is achieved using conventional processes for removing photoresist. Although there is no photoresist shown in FIG. 8, there may be some remnant of photoresist and etch reactants left that are removed typically by ashing. This ashing is also effective in reacting away the material that is used for organic ARC 18. A combination of wet cleans, such as a piranha and SCI, is also conventional which in combination with the ashing is certain to remove all of the ARC 18 material. Thus, there is no additional removal step required for removing ARC portion 36.

Figure 10:
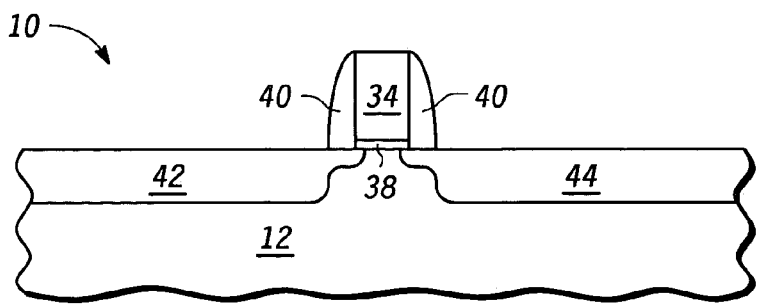
FIG. 10 is a cross section of the semiconductor device of FIG. 9 at a subsequent stage in processing.

FIG. 10 illustrates semiconductor device 10 as a completed transistor after sidewall 40 formation and source 42 and drain 44 implants, which is formed in conventional manner after a gate conductor has been formed over a gate dielectric. Thus, this use of low temperature TEOS does not cause any unusual or extra steps in the transistor formation after gate formation.

Photoresist adheres well to the plasma treated low temperature TEOS as contrasted with conventional 400 degree TEOS from which the photoresist tends to delaminate, especially for photoresists that are designed for 193 nanometer lithography. Also the plasma treated low temperature TEOS adheres well to the underlying organic ARC layer.

An alternative to the above described TEOS solution is to use a organosilane plus an oxidizer to form the layer between ARC 18 and photoresist 22 in the place of TEOS layer 20. The organosilane and oxidizer should be nitrogen-free. TEOS is preferable at least because the chemicals for it are less expensive and tool availability is better. TEOS is also a very stable film. This stability may be difficult to match. A typical organosilane for this purpose is trimethlysilane. A typical oxidizer would be either pure oxygen or carbon dioxide.

Another alternative to the TEOS solution is to use silicon nitride in combination with one of silicon-rich oxynitride (SRON) and silicon-rich oxide (SRO). In one case the combination would be a composite layer that would replace TEOS layer 20. The silicon nitride layer would be on the organic ARC 16 and the SRON or SRO layer would be between the photoresist and the silicon nitride layer. This is effective in providing both the necessary adhesion and the low defectivity. In another case the combination would be separated by the organic ARC. The silicon nitride layer would be between the conductive layer 16 and the ARC layer 18. The SRON or SRO layer would be between the ARC layer 18 and the photoresist. This is also effective in providing adequate adhesion and defectivity. These two alternatives using SRO or SRON in combination with silicon nitride are both more complicated than the TEOS solution and provide a more difficult integration with preferred processes.

In the foregoing specification, the invention has been described with reference to specific embodiments. However, one of ordinary skill in the art appreciates that various modifications and changes can be made without departing from the scope of the present invention as set forth in the claims below. For example, the organic ARC may not have to be amorphous. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device, comprising:
    providing a semiconductor substrate;
    forming a first layer over the semiconductor substrate;
    forming an anti-reflective coating (ARC) layer over the first layer;
    forming a tetra-ethyl-ortho-silicate (TEOS) layer over the ARC layer;
    after forming the TEOS layer, applying a nitrogen-based plasma to the TEOS layer;
    after applying the nitrogen-based plasma, applying an oxygen-based plasma to the TEOS layer at a temperature of at most about 300 degrees Celsius;
    forming a photoresist layer over the TEOS layer;
    patterning the photoresist layer to form a patterned photoresist layer; and
    using the patterned photoresist layer to pattern the first layer.

2. The method of claim 1, wherein the nitrogen-based plasma is applied at a temperature of at most about 300 degrees Celsius.

3. The method of claim 1, wherein the nitrogen-based plasma further comprises a secondary gas.

4. The method of claim 1, wherein the TEOS layer is formed at a temperature in a range of about 175 to 400 degrees Celsius.

5. The method of claim 1, wherein the TEOS layer is formed at a temperature in a range of about 175 to 250 degrees Celsius.

6. The method of claim 1, wherein the oxygen-based plasma further comprises a secondary gas.

7. The method of claim 1, wherein the first layer comprises a conductive material.

8. The method of claim 1, wherein the first layer is patterned to form a gate electrode.

9. The method of claim 8, further comprising:
    forming sidewall spacers on the gate electrode; and
    diffusing source/drain regions into the substrate.

10. The method of claim 1, wherein applying the oxygen-based plasma reduces pattern defects of the photoresist layer.

11. The method of claim 1, wherein the ARC layer comprises one of an organic ARC (OARC) layer or a spin-on bottom ARC (BARC) layer.

12. A method for forming a semiconductor device, comprising:
    providing a semiconductor substrate;
    forming a first layer over the semiconductor substrate;
    forming an anti-reflective coating (ARC) layer over the first layer;
    forming a tetra-ethyl-ortho-silicate (TEOS) layer over the ARC layer;
    after forming the TEOS layer, applying a nitrogen-based plasma to the TEOS layer at a temperature of at most about 300 degrees Celsius;
    after forming the TEOS layer, applying an oxygen-based plasma to the TEOS layer at a temperature of at most about 300 degrees Celsius;
    forming a photoresist layer over the TEOS layer;
    patterning the photoresist layer to form a patterned photoresist layer; and
    using the patterned photoresist layer to pattern the first layer.

13. The method of claim 12, wherein the nitrogen-based plasma is applied prior to the oxygen-based plasma is applied.

14. The method of claim 12, wherein each of the nitrogen-based plasma and the oxygen-based plasma is applied at a temperature of at most about 250 degrees Celsius.

15. The method of claim 12, wherein each of the nitrogen-based plasma and the oxygen-based plasma are applied to reduce pattern defects of the photoresist layer.

16. The method of claim 12, wherein the first layer is patterned to form a gate electrode, the method further comprising;
    forming sidewall spacers on the gate electrode; and
    diffusing source/drain regions into the substrate.

17. The method of claim 14, wherein the TEOS layer is formed at a temperature of at most about 300 degrees Celsius.

18. The method of claim 12, wherein the ARC layer comprises one of an OARC layer or a spin-on BARC layer.

19. A method for forming a semiconductor device, comprising:
    providing a semiconductor substrate;
    forming a first layer over the semiconductor substrate;

forming an anti-reflective coating (ARC) layer over the first layer;

forming a tetra-ethyl-ortho-silicate (TEOS) layer over the ARC layer, wherein the TEOS layer is formed at a temperature of at most about 250 degrees Celsius;

after forming the TEOS layer, applying a nitrogen-based plasma to the TEOS layer;

after applying the nitrogen-based plasma, applying an oxygen-based plasma to the TEOS layer at a temperature of at most about 300 degrees Celsius;

forming a photoresist layer over the TEOS layer;

patterning the photoresist layer to form a patterned photoresist layer; and using the patterned photoresist layer to pattern the first layer.

20. The method of claim 19, wherein the oxygen-based plasma is applied at a temperature of at most about 250 degrees Celsius.

21. The method of claim 19, wherein the oxygen-based plasma is applied to reduce pattern defects of the photoresist layer.

22. The method of claim 19, wherein the first layer is patterned to form a gate electrode, the method further comprising:

forming sidewall spacers on the gate electrode; and diffusing source/drain regions into the substrate.

23. The method of claim 19, wherein the ARC layer comprises one of an OARC layer or a spin-on BARC layer.

* * * * *